(12) United States Patent
Lee et al.

(10) Patent No.: US 9,356,772 B2
(45) Date of Patent: May 31, 2016

(54) HYBRID CLOCK AND DATA RECOVERY CIRCUIT AND SYSTEM INCLUDING THE SAME

(71) Applicant: Samsung Electronics Co., Ltd., Suwon-si, Gyeonggi-do (KR)

(72) Inventors: Jung-Hee Lee, Yongin-si (KR); Jongshin Shin, Yongin-si (KR); YoungKyun Jeong, Hwaseong-si (KR); Dongchul Choi, Yongin-si (KR); Jung-Hoon Chun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/489,986

(22) Filed: Sep. 18, 2014

(65) Prior Publication Data

US 2016/0013927 A1    Jan. 14, 2016

(30) Foreign Application Priority Data

Jul. 14, 2014    (KR) .......................... 10-2014-0088462

(51) Int. Cl.
*H04L 7/033*    (2006.01)
*H04L 27/22*    (2006.01)

(52) U.S. Cl.
CPC ................. *H04L 7/033* (2013.01); *H04L 27/22* (2013.01)

(58) Field of Classification Search
CPC ..... H03L 7/0807; H03L 7/091; H03L 7/0814; H03L 7/0337; H03L 7/0331; H03L 7/033
See application file for complete search history.

(56) References Cited

U.S. PATENT DOCUMENTS

| 7,961,830 | B2 | 6/2011 | Okamura et al. |
| 8,320,770 | B2 | 11/2012 | Nedovic |
| 8,374,305 | B2 | 2/2013 | Takada |
| 2004/0210790 | A1* | 10/2004 | Moon et al. ................... 713/500 |

(Continued)

FOREIGN PATENT DOCUMENTS

| JP | 2012209795 A | 10/2012 |
| KR | 101129055 B1 | 3/2012 |

(Continued)

OTHER PUBLICATIONS

Yuping Chung , "Universal Flash Storage: Mobilize your Data", Arasan Chip Systems, D&R Industry Articles, Nov. 2012.*

(Continued)

*Primary Examiner* — Aristocratis Fotakis
(74) *Attorney, Agent, or Firm* — Harness, Dickey & Pierce, P.L.C.

(57) ABSTRACT

A clock data recovery circuit includes a sampler to sample incoming data bits, a phase detector to generate an edge position signal and a polarity signal based on the sampled incoming data, a finite state machine to save a current edge position state, a polarity decision unit to generate a polarity inversion signal to invert the polarity signal, a gain controller to generate a tracking bandwidth signal, a recovery loop configured to adjust an edge offset of the reference clock, and a bit selector configured to recover the incoming data. The clock data recovery circuit has a first latency at a first operation mode and a second latency at a second operation mode. The phase detector in the clock data recovery circuit may include a first phase detector and a second detector combined together for a low latency and low lock time of the clock data recovery circuit.

18 Claims, 7 Drawing Sheets

(56) References Cited

U.S. PATENT DOCUMENTS

| | | | | |
|---|---|---|---|---|
| 2006/0062341 | A1* | 3/2006 | Edmondson et al. | 375/376 |
| 2007/0047683 | A1* | 3/2007 | Okamura et al. | 375/355 |
| 2010/0054760 | A1* | 3/2010 | Fukuda | 398/202 |
| 2010/0241918 | A1 | 9/2010 | Nedovic | |
| 2010/0322367 | A1* | 12/2010 | Wenske et al. | 375/373 |
| 2011/0064176 | A1 | 3/2011 | Takada | |
| 2011/0194659 | A1* | 8/2011 | Kenney | 375/355 |
| 2011/0267122 | A1 | 11/2011 | Jeong et al. | |
| 2012/0106689 | A1* | 5/2012 | Byun | 375/374 |
| 2013/0113534 | A1* | 5/2013 | Wachi et al. | 327/148 |
| 2013/0243107 | A1* | 9/2013 | Chmelar et al. | 375/259 |

FOREIGN PATENT DOCUMENTS

| | | |
|---|---|---|
| KR | 101202084 B1 | 11/2012 |
| KR | 1020120129019 A | 11/2012 |

OTHER PUBLICATIONS

Jae-Wook Kwon, Xuefan Jin, Gyoo-Cheol Hwang, Jung-Hoon Chun and Kee-Won Kwon, "A 3.0 Gb/s Clock Data Recovery Circuits Based on Digital DLL for Clock-Embedded Display Interface", Sungkyunkwan University, Samsung Electronics, IEEE, 2012.*

June-Hee Lee et al., "A fully digital clock and data recovery with fast frequency offset acquisition technique for MIPI LLI applications", IEICE Electronics Express, May 24, 2013, vol. 10, No. 10, pp. 1-7.

June-Hee Lee et al., "A Tracked Oversampling Digital Data Recovery for Low Latency, Fast Acquisition, and High Jitter Tolerance", IEEE 2013, pp. 1027-1030.

Marcus van Ierseel et al., "A 3.2 Gb/s CDR Using Semi-Blind Oversampling to Achieve High Jitter Tolerance", IEEE Journal of Solid-State Circuits, vol. 32, No. 10, Oct. 2007, pp. 2224-2234.

\* cited by examiner

HYBRID CLOCK AND DATA RECOVERY CIRCUIT AND SYSTEM INCLUDING THE SAME

CROSS-REFERENCE TO RELATED APPLICATIONS

A claim for priority under 35 U.S.C. §119 is made to Korean Patent Application No. 10-2014-0088462 filed Jul. 14, 2014, in the Korean Intellectual Property Office, the entire contents of which are hereby incorporated by reference.

TECHNICAL FIELD

The present inventive concepts relates to a clock and data recovery (CDR) circuit, and more particularly, to a hybrid CDR circuit in a system on chip (SoC).

DISCUSSION OF THE RELATED ART

The fast advance of interconnection technologies has reduced the cost of electronic components in mobile devices. In a conventional mobile device, a modem usually requires its own discrete DRAM besides of the DRAM attached to an application processor. However, with a low latency interface such as MIPI LLI (Low Latency Interface), the modem and application processor can share the DRAM, and phone manufacturers can remove the DRAM dedicated to the modem. The round-trip latency required to maintain enough read throughput for cache refill is shorter than 100 ns in MIPI LLI. Hence, the CDR for MIPI LLI has to extract clock and data with a low latency, and the lock time should be much faster than that of the conventional phase tracking CDR. Furthermore, these requirements for MIPI LLI should be met in highly stressed mobile environments.

Some conventional digital CDR architectures realize fast recovery with a moderate frequency offset tracking range, or the advantage of offset-free tracking ability. However, they have the disadvantage of a long lock time due to slow accumulation of the integral path.

On the other hand, conventional oversampling architecture significantly reduced lock time using multi-phase blind oversampling. But the latency in the oversampling CDR increases comparing with other CDR architectures due to a wide examining window for the threshold decision technique and an elastic FIFO which is used to adapt frequency difference between two clock domains for the oversampled multi-phase input stream.

Thus, the ideal digital data recovery needs a fast lock time and a low logic latency with high jitter tolerance for applications such as MIPI LLI. Furthermore, a common CDR architecture to support different CDR features for various interconnection PHYs will be helpful to reduce a cost in a SoC design.

SUMMARY

Some of the present inventive concepts provide a clock data recovery circuit capable of having a low latency and a low lock time and supporting a plurality of bit rates of incoming data bits according to a plurality of operating modes. Some of the present inventive concepts provide a data recovery circuit capable of having a low latency and a low lock time and supporting a plurality of bit rates of incoming data bits according to a plurality of operating modes. Some of the present inventive concepts provide a data processing system capable of sharing a memory between function blocks having same hybrid clock data recovery circuit.

An example embodiment of the present inventive concepts is directed to a clock data recovery circuit may include a sampler configured to generate a first set of sampling data bits based on incoming data bits inputted at a first bit rate or generate a second set of sampling data bits based on the incoming data bits inputted at a second bit rate, a first phase detector configured to generate a first edge position signal based on the first set of sampling data bits or the second set of sampling data bits, a second phase detector configured to generate a second edge position signal based on the second set of sampling data bits, and a bit selector configured to recover the incoming data bits based on the first edge signal and the second edge signal.

According to an example embodiment, the sampler may sample the incoming data bits inputted at the first bit rate at quadrature phases and samples the incoming data bits inputted at the second bit rate at dual phases according to a multi-phase clock signal. According to an example embodiment, the first phase detector may be a bang-bang phase detector. According to an example embodiment, the second phase detector may be an oversampling phase detector. According to an example embodiment, the first phase detector may generate a polarity signal based on the first edge position signal.

According to an example embodiment, the second phase detector may include an oversampling phase detector configured to generate the second edge position signal, a finite state machine configured to save a current edge position state based on the second edge position signal, a polarity decision unit configured to output a polarity inversion signal to the first phase detector, and a gain controller to configured to generate a tracking bandwidth signal based on the current edge position state. According to an example embodiment, the clock data recovery circuit may further include a recovery loop configured to adjust an edge offset of the multi-phase clock signal based on the polarity signal and the tracking bandwidth signal. According to an example embodiment, the polarity decision unit may invert the polarity signal based on the current edge position state and the first edge position signal.

According to an example embodiment, the recovery loop may include a proportional gain unit configured to generate a proportional gain, an integrator configured to accumulate a polarity decision result based on the polarity signal, an integral gain unit configured to generate an integral gain based on the accumulated polarity decision result, an adder configured to generate an added gain by adding the proportional gain and the integral gain, and an interpolator configured to adjust the edge offset of the multi-phase clock signal based on the polarity signal and the tracking bandwidth signal.

According to an example embodiment, the magnitude of the tracking bandwidth signal may vary in discrete steps according to the current edge position state. According to an example embodiment, the first bit rate may be half of the second bit rate. According to an example embodiment, the incoming data bits may be inputted to the sampler at the first bit rate in a first operation mode and at the second bit rate in a second operation mode. According to an example embodiment, the polarity decision unit may activate the polarity inversion signal when an edge position of the incoming data bits detected based on the first edge position signals and the current edge position state is out of 1-bit boundary of the incoming data bits.

An example embodiment of the present inventive concepts is directed to a data recovery circuit may include a sampler configured to generate a first set of sampling data bits in a first operation mode and generate a second set of sampling data bits in a second operation mode by sampling incoming data bits based on a multi-phase clock signal, a phase detector configured to generate an edge position signal and a polarity signal based on the first set of sampling data bits or the second set of sampling data bits, a finite state machine configured to save a current edge position state based on the edge position signal, a polarity decision unit configured to generate a polarity inversion signal to invert the polarity signal based on the saved edge position state and the edge position signal, a gain controller configured to generate a tracking bandwidth signal based on the saved edge position state, a recovery loop configured to adjust an edge offset of the multi-phase clock signal based on the polarity signal and the tracking bandwidth signal, and a bit selector configured to recover the incoming data bits based on the saved edge position state.

According to an example embodiment, the incoming data bits may be inputted at a first bit rate in the first operation mode and the incoming data is inputted at a second bit rate in the second operation mode. According to an example embodiment, the phase detector may include a first phase detector configured to generate a first edge position signal based on the first set of sampling data bits or the second set of sampling data bits, and a second phase detector configured to generate a second edge position signal based on the second set of sampling data bits. According to an example embodiment, the magnitude of the tracking bandwidth may vary in discrete steps according to the saved edge position state. According to an example embodiment, the polarity decision unit may activate the polarity inversion signal when an edge position of the incoming data bits detected based on the edge position signal and the current edge position state is out of 1-bit boundary of the incoming data bits.

An example embodiment of the present inventive concepts is directed to a data processing system may include a UFS interface configured to communicate at a first bit rate, a MIPI LLI interface configured to communicate at a second bit rate, a first hybrid CDR circuit connected to the UFS interface, and a second hybrid CDR circuit connected to the MIPI LLI interface, wherein each of the first hybrid CDR circuit and the second hybrid CDR circuit has a first latency at a first operation mode and a second latency at a second operation mode.

According to an example embodiment, the data processing system may further include an application processor, a baseband IC, and a memory having a MIPI LLI interface shared by the application processor and the baseband IC.

BRIEF DESCRIPTION OF THE DRAWINGS

Example embodiments of the present inventive concepts will be more clearly understood from the following detailed description taken in conjunction with the accompanying drawings in which.

DETAILED DESCRIPTION OF THE EMBODIMENTS

Figure 1:
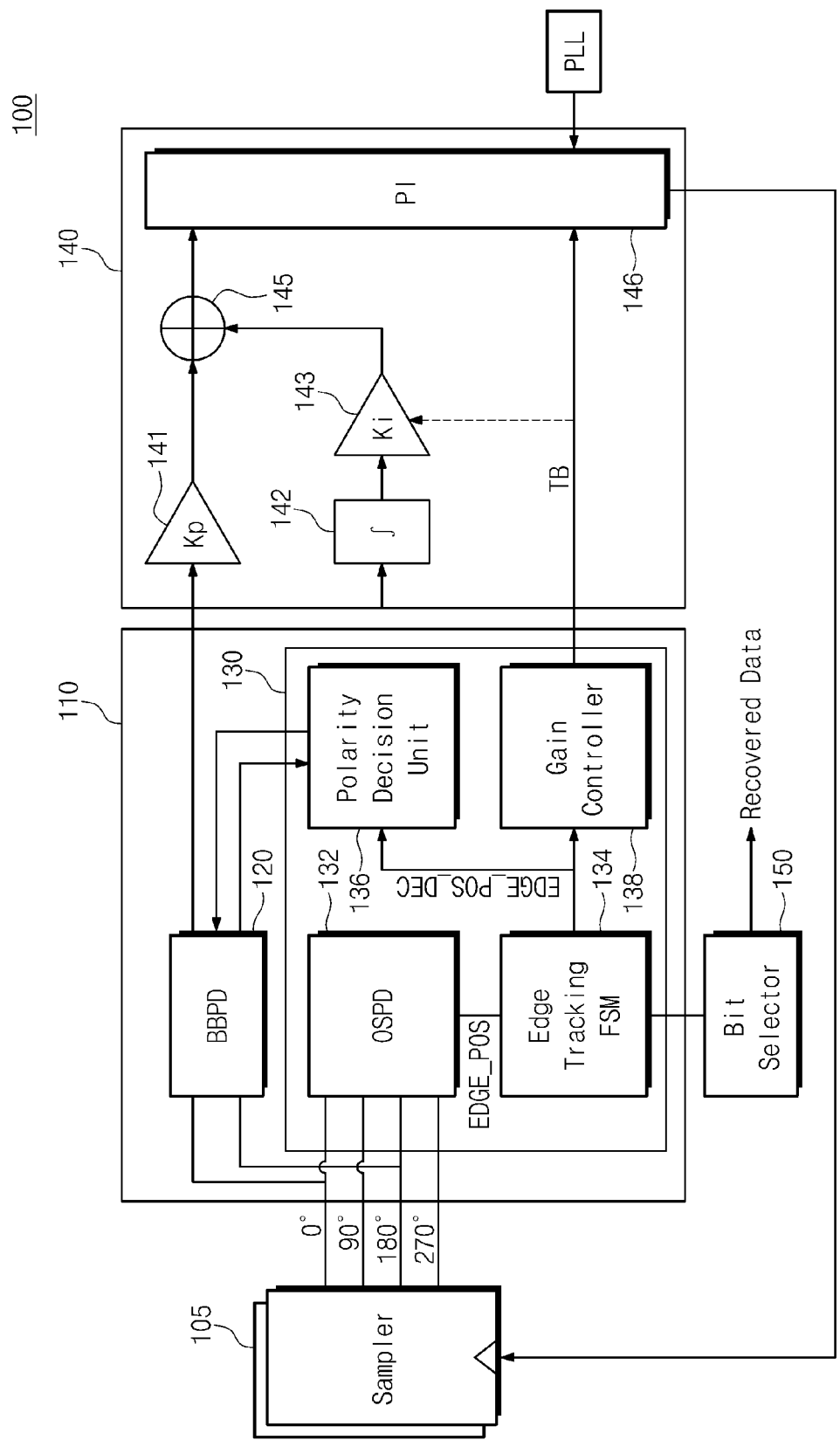
FIG. 1 is a block diagram of a digital data recovery circuit according to an example embodiment of the present inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, example embodiments of the invention should not be construed as limited to the particular shapes of regions illustrated herein but are to include deviations in shapes that result, for example, from manufacturing.

FIG. 1 is a block diagram of a digital data recovery circuit according to an example embodiment of the present inventive concepts.

Referring to FIG. 1, the digital data recovery circuit 100 may include a sampler 105, a phase detector 110, a recovery loop 140 and a bit selector 150.

The recovery loop 140 may generate a multi-phase clock signal MPCLK based on a reference clock signal RCLK and a bit rate of incoming data. The multi-phase clock signal MPCLK may be used as a sampling clock. The reference clock signal RCLK may be generated by a clock generator such as PLL which uses a clock source, for example an external crystal oscillator. The multi-phase clock signal MPCLK may include quadrature phase clock signals that have 0°, 90°, 180°, 270° phase compared to the incoming data bit rate. Thus, if the phase 180° is the edge of the incoming data, the phase 0° means the center of the incoming data bit.

The sampler 105 may receive incoming data bits successively. The incoming data bits may be a data bit stream transferred at high speed by a differential signal channel. The sampler 105 may generate a set of sampled data bits by sampling each incoming data bit of the data bit stream at different phases in responsive to the multi-phase clock signal MPCLK. For example, the set of sampled data bits may be four sampled data bits when the multi-phase clock signal MPCLK includes quadrature phases 0°, 90°, 180°, 270°. Here, the sampler 105 may sample the incoming data bit at at least one of rising edge and falling edge of the multi-phase clock signal MPCLK.

The sampler 105 may include a plurality of flip-flops that latch the incoming data bit in response to the multi-phase clock signal MPCLK. Each of the plurality of flip-flops may correspond to each phase clock signal of the multi-phase clock signal MPCLK and generate the set of sampled data bits having different clock phases respectively.

The phase detector 110 may be connected to the sampler 105, recovery loop 140 and the bit selector 150. The phase detector 110 may receive a set of sampled data bits from the sampler 105 and output a polarity signal X and Y to the recovery loop 140 and a tracking bandwidth signal TB to the recovery loop 140. Also, the phase detector 110 may output a bit of the set of sampled data bits to the bit selector 150.

The phase detector 110 may include a first phase detector 120 and a second phase detector 130 such as a bang-bang phase detector and an oversampling phase detector. The first phase detector 120 may generate a first set of sampled data bits in response to the multi-phase clock signal MPCLK and the second phase detector 130 may generate a second set of sampled data bits in response to the multi-phase clock signal MPCLK.

The first phase detector 120 may generate a pre-polarity signal X' and Y' and a polarity signal X and Y in response to a polarity inversion signal POL_INV_EN. The first phase detector 120 may refer to the first set of sampled data bits to generate the polarity signal X and Y. The first phase detector 120 may be a bang-bang phase detector to 2× oversample incoming data bits to determine the polarity of edge position change of the incoming data bits based on two phase sampled data bits. For example, the two phase points may be 0°, 180° and the first phase detector 120 may latch at least one of the two phase sampled data bits and compare the latched sampled data bits and current sampled data bits to detect the movement of the edge.

When the polarity inversion signal POL_INV_EN is high, the first phase detector 120 may output exchanged pre-polarity signal X' and Y' as the polarity signal X and Y.

The first phase detector 120 may sample the incoming data twice at 0°, 180° phase regardless of the bit rate of the incoming data, for example 3 Gb/s or 6 Gb/s. Because the recovery loop 140 may generate the multi-phase clock signal MPCLK according to the incoming data bit rate, when the phase 180° aligns the edge of the incoming data, the phase 0° aligns to the center of the incoming data.

Although the first phase detector is illustrated as a bang-bang phase detector according to the example embodiment of the present invention, the first phase detector is not limited but may be any linear or non-linear phase detector such as conventional Hogge phase detector, Alexander phase detector, etc. In this case, the sampler 105 may use only one clock signal of the multi-phase clock signal MPCLK and provide two sampled data bits to the first phase detector 120 by sampling twice at phases 0° and 180° corresponding to both rising edge and falling edge of the one clock signal.

The second phase detector 130 may generate the tracking bandwidth signal TB based on the multiple sampled data bits. The second phase detector 130 may refer to a second set of the sampled data bits that is sampled according to the multi-phase clock signal MPCLK having different phases, for example 0°, 90°, 180°, 270°, based on the incoming data bit rate.

The second phase detector 130 may be connected to the first phase detector 120 and the recovery loop 140. The second phase detector 130 may include an oversample phase detector 132, an edge tracking FSM (Finite State Machine) 134, a polarity decision unit 136 and a gain controller 138.

The oversample phase detector (hereafter OSPD) 132 may oversample the incoming data according to the multiple phases clock signal MPC and provide an edge position signal EDGE_POS to the edge tracking FSM 134. The multi-phase clock signal MPC may have quadrature phase clock signals, for example 0°, 90°, 180°, 270°. Here, The pre-polarity signal X' and Y' may be a first edge position signal and the edge position signal EDGE_POS may be a second edge position signal.

The first phase detector 120 and the oversampling phase detector 132 may be merged as a phase detector because they can share the sampled data with different phases (0°, 90°, 180°, 270°).

The edge tracking FSM (hereafter ET-FSM) 134 may determine a current edge position state by monitoring the edge position signal EDGE_POS provided by the second phase detector 130 132. The edge tracking FSM 134 may save the current edge position state as a state of the ET-FSM 134 and output the current edge position state. The ET-FSM 134 may track the edge of the incoming data bits even when the edge of the incoming data bits is out of the bit boundaries (over ±180°). In other words, the ET-FSM 134 may track the incoming data bits up to the wide range of over ±1 UI (Unit Interval). A detected phase difference may be converted into a digital logic state by the ET-FSM 134, and decoded state outputs of the ET-FSM 134 may be provided as an edge position decoding signal EDGE_POS_DEC to the gain controller 138 and the bit selector 150. The edge position decoding signal EDGE_POS_DEC may include information about a phase difference between the edge of the incoming data bits and the edge of the multi-phase clock signal MPCLK.

The polarity decision unit 136 may receive the pre-polarity signal X' and Y' from the first phase detector 120 and the edge position decoding signal EDGE_POS_DEC from the ET-FSM 134, and detect the phase difference is out of the bit boundaries (over ±180°). The edge position decoding signal EDGE_POS_DEC may include information about the state of the ET-FSM 134, for example SLOW2 or FAST2 in FIGS. 2 to 3, and a direction of error, for example leading (LEAD) or lagging (LAG). When the oversampling phase detector 132 generates the edge position signal EDGE_POS by oversampling the bit boundary region, the edge of the incoming data bits may be out of the 1-bit boundary region. Thus, if the ET-FSM 134 saves the previous edge position, the ET-FSM 134 may track over the bit boundary of the incoming data bits. For example, when the state of the ET-FSM 134 is SLOW2 with lagging (LAG; X'=1) or FAST2 with leading (LEAD; Y'=1), the ET-FSM 134 may avoid wrong adjustment by inversing the adjustment direction by the polarity decision unit 136 since the phase error is over 1-bit boundary. The polarity decision unit 136 may provide a polarity inversion signal POL_INV_EN to the first phase detector 120.

When the ET-FSM 134 detects that the edge position of the incoming data bit is out of the bit boundaries (over ±180°), the polarity decision unit 136 may invert the polarity of the first phase detector output, and the first phase detector can pull the sampling point toward the data eye center which is the center of the incoming data bit. The gain controller also may receive the decoded outputs of the states of the ET-FSM 134, and output the tracking bandwidth signal TB to the recovery loop 140. The detail structure and operation of the second phase detector 130 connected to the first phase detector 120 and the recovery loop 140 will be described in FIGS. 2 to 5.

The recovery loop 140 may include a proportional gain unit 141, an integrator 142, an integral gain unit 143, an adder 144, an up/down unit 145 and a phase interpolator 146. The recovery loop 140 may include a proportional path from the proportional gain unit 141 to the adder 144 and an integral path from the integrator 142 to the adder 144 through the integral gain unit 143.

On the proportional path, the proportional gain unit 141 may receive the polarity signal X and Y from the first phase detector 120 as a first gain control signal. The polarity signal X and Y may be a polarity decision signal to indicate whether the sampling point according to the phase 0° clock signal is on left side or right side from the center of the incoming data bit. The proportional gain unit 141 may output to the adder 144 a proportional gain output PGO by multiplying the polarity signal X and Y by the proportional gain Kp. The proportional gain output PGO is increased or decreased based on the polarity signal X and Y.

On the integral path, the integrator 142 may accumulate the polarity decision result on by monitoring whether the sampling point according to the phase 0° clock signal is on left side or right side from the center of the incoming data bit by the polarity signal X and Y. The integrator 142 provides the accumulated polarity decision result to the integral gain unit 143. The integral gain unit 143 may output to the adder 144 an integral gain output IGO by multiplying an output of the integrator 142 by an integral gain Ki. The integral gain output IGO may be increased or decreased based on the accumulated polarity decision result. By accumulating the polarity decision result about phase shift, the integral path may compensate unstable change of the proportional path.

The adder 144 is connected to the proportional gain unit 141 and the integral gain unit 143 and output an up/down signals UP and DN to the phase interpolator 146 by adding the proportional gain output PGO and the integral gain output IGO. As a result, the proportional gain unit 141 and the integral gain unit 143 may adjust position of the sampling point based on the multi-phase clock signal MPCLK generated by the recovery loop 140 by adjusting the proportional gain output PGO and the integral gain output IGO.

The gain controller 138 may receive the edge position decoding signal EDGE_POS_DEC from the ET-FSM 134 and output the tracking bandwidth signal TB to control phase shift of the multi-phase clock signal MPCLK. The gain controller 138 may output the tracking bandwidth signal TB to the integral gain unit 143 of the recovery loop 140 as a second gain control signal GC2 or to the phase interpolator 146 based on a state transition in the ET-FSM 134. The tracking bandwidth signal TB may include a stepwise phase shift information for the multi-phase clock signal MPCLK. As a result, the data recovery circuit 100 may adaptively control the phase interpolator 146 by the up/down signal UP/DN and the tracking bandwidth signal TB.

The bit selector 150 may select a data bit closest to the data eye center among a set of sampled data bits based on the edge position signal of the phase detector 110.

Figure 2:
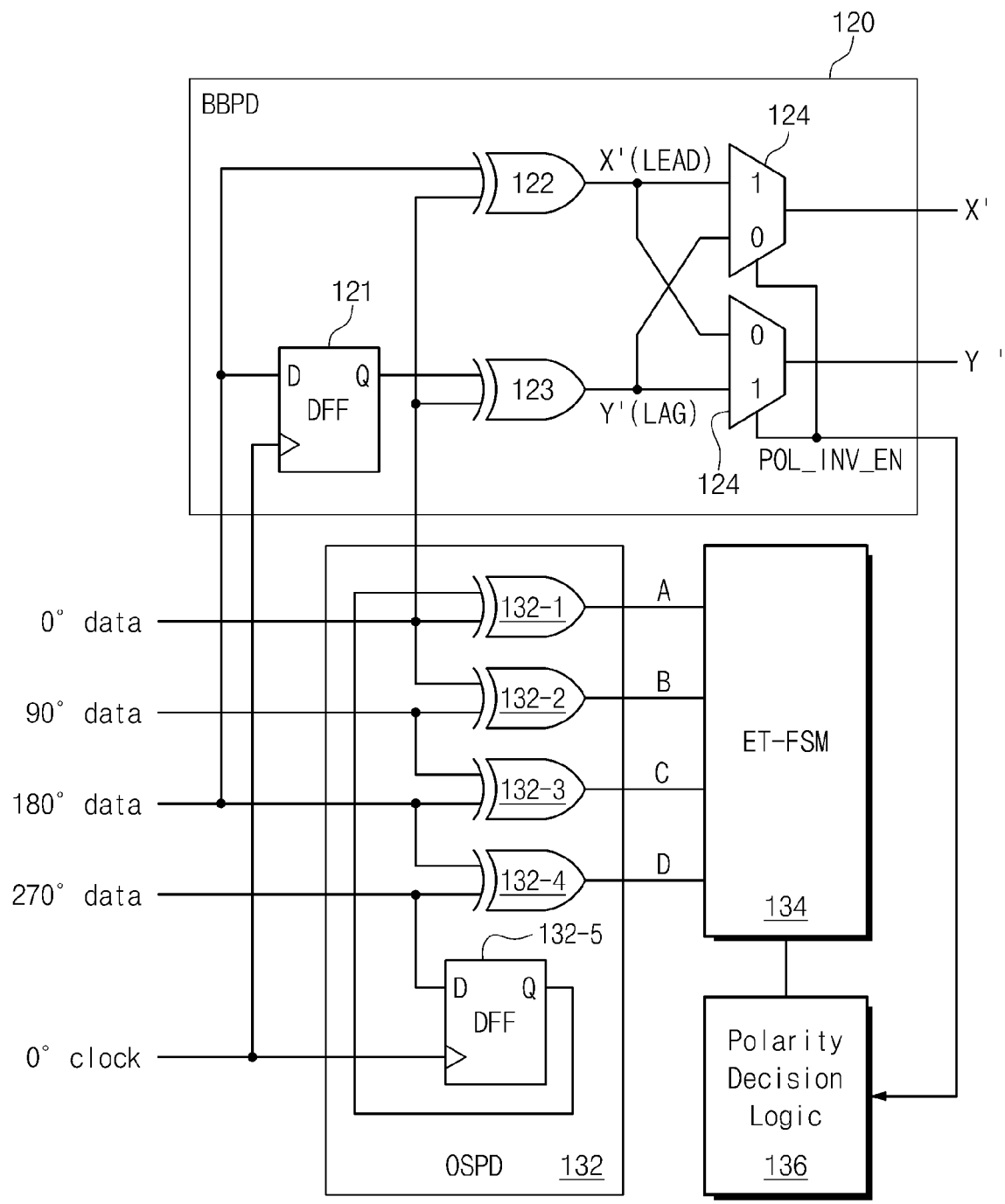
FIG. 2 is a block diagram of a hybrid phase detector according to the example embodiment of the present inventive concepts shown in FIG. 1.

FIG. 2 is a hybrid phase detector according to then example embodiment of the present inventive concepts in FIG. 1.

Referring to FIGS. 1 and 2, a first phase detector 120 may be connected to a second phase detector 130. The second phase detector 130 may include an oversampling phase detector 132, an ET-FSM 134 and a polarity decision unit 136.

FIG. 2 shows a composite structure including a bang-bang phase detector (hereafter BBPD) as a first phase detector 120 and an oversampling phase detector (hereafter OSPD) as a second phase detector 130. The sampler 105 may provide four phase (0°, 90°, 180°, and 270°) incoming data bits to the oversampling phase detector 132 to generate the current edge position signal EDGE_POS. The current edge position signal EDGE_POS may include four regional edge position signals A, B, C and D according to the four phase input data. Each of the regional edge position signals A, B, C and D may correspond to a predetermined position of each incoming data bit.

A 4× oversampling scheme for OSPD may be adopted instead of 3× or 5× oversampling scheme because the first phase detector 120 requires sampling data bits sampled at 0° and 180° phase. However the sampling phase relationship between the first phase detector 120 and the second phase detector 130 is not limited thereto, and may include a different phase combination.

The four sampled data bits and a latched sampled data bit by a flip-flop 132-5 may be XORed by XOR gates 132-1~132-4 and output to the ET-FSM 134 the regional edge position signals A, B, C and D which indicate where an edge of the incoming data bit exists.

The two sampled data bits (0° and 180°) may be provided to the first phase detector 120 to bring the edge of the 0° phase clock signal to the data eye center of the sampled data bit. The first phase detector 120 may be connected to the proportional path to track the phase. Two sampled data bits at phase 0° and 180° and a latched data bit at the phase 180° by a flip-flop 121 may be XORed by XOR gates 122~123 and generate the pre-polarity signal X' and Y'.

The outputs of the XOR gate 122 and 123 may be connected to multiplexers 124 and 125 and output the polarity signal X or Y respectively in response to the position inversion signal POL_INV_EN. The position inversion signal POL_INV_EN is generated by the polarity decision unit 136 connected to the ET-FSM 134 as described in FIG. 1. The polarity signal X and Y may indicate the polarity of the phase shift, that is, whether sampling clock is leading the sampled data bit (X is high) or lagging (Y is high).

Figure 3:
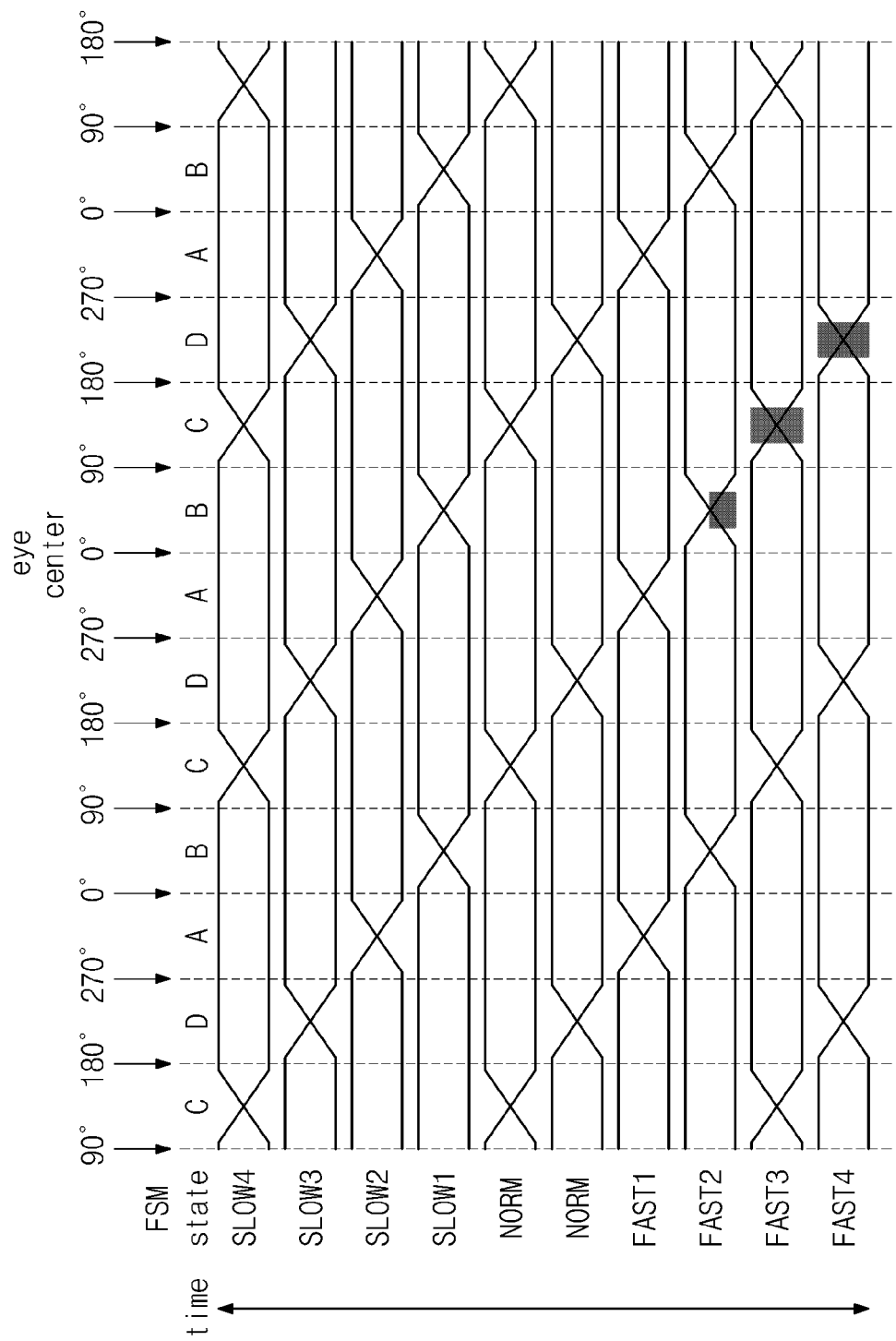
FIG. 3 is a timing diagram to illustrate states of the ET-FSM 134 and the position of the sampling points shown in FIG. 1.
Figure 4:
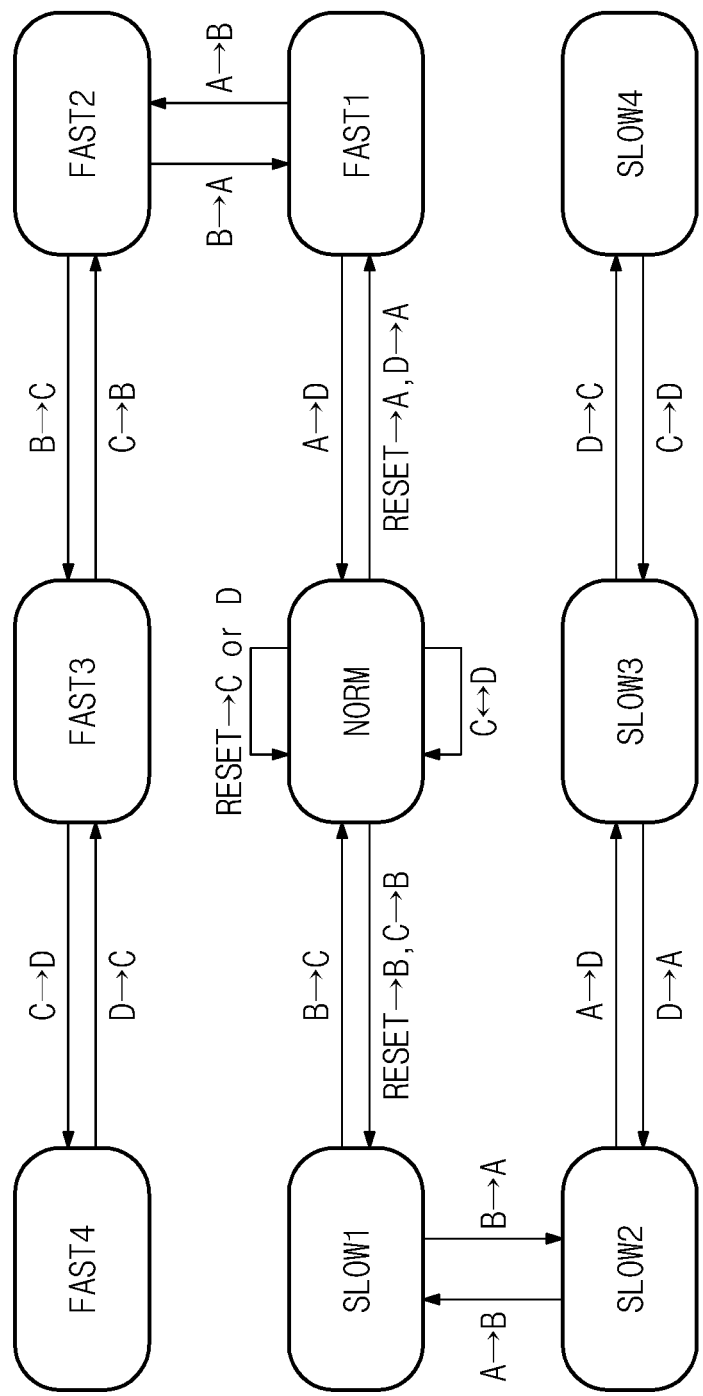
FIG. 4 is a state transition diagram of the ET-FSM according to an example embodiment of the present inventive concepts.

FIG. 3 is a timing diagram to illustrate states of the ET-FSM 134 and the position of the sampling points, and FIG. 4 is a state transition diagram of the ET-FSM according to an example embodiment of the present inventive concepts.

Referring to FIGS. 3 and 4, a data eye center may correspond to phase 0° of the multi-phase clock signal MPCLK and correspond to the range of 0.5 UI including the center of the incoming data bit in the middle of the incoming data bit. A detected edge of the incoming data bit may be defined as the end position of the incoming data bit. The oversampling phase detector 132 may generate each of the regional edge position signals A to D which indicate 4 divided phase areas A to D of the 1-bit width of an incoming data respectively. Each of the divided phase areas A to D may correspond to 270°-0°, 0°-90°, 90°-180° and 180°-270° phase area respectively.

The state of the ET-FSM 134 may be determined by the edge position signal EDGE_POS including the regional edge position signals A to D of the current incoming data bit. The ET-FSM 134 in FIG. 1 may have the normal state NORM when a detected edge (tail edge of the incoming data) is located in phase area C or D in FIG. 3. The detected edge may be located outside of phase areas from A to D. By saving the previous edge position and referring the current edge position, the clock data recovery circuit 100 may track the incoming data bit even out of the bit boundaries (over ±180°).

When the state of the ET-FSM 134 is NORM and the detected edge is located before phase area C, for example in phase area B, the state of the ET-FSM 134 may move to a first slow state SLOW1 because the detected edge (tail edge) before phase area C means that the phase 0° sampling point is shifted right from the data eye center of the incoming data bit and the sampling point is late compared to the data eye center. Similarly, when the state of the ET-FSM 134 is SLOW1 and the detected edge is located before phase area B, for example in phase area A, the state of the ET-FSM 134 may be move to a second slow state SLOW2. When the state of the ET-FSM 134 is SLOW2 and the detected edge is located before phase area A, for example in phase area D, the state of the ET-FSM 134 may move to a third slow state SLOW3. When the state of the ET-FSM 134 is SLOW3 and the detected edge is located before phase area D, for example in phase area C, the state of the ET-FSM 134 may move to a fourth slow state SLOW4.

On the other hand, when the state of the ET-FSM 134 is NORM and the detected edge is located after phase area D, for example in phase area A, the state of the ET-FSM 134 may move to a first fast state FAST1 because the detected edge (tail edge) after phase area D means that the phase 0° sampling point is shifted left from the data eye center of the incoming data bit and the sampling point is early compared to the data eye center. Similarly, when the state of the ET-FSM 134 is FAST1 and the detected edge is located after phase area A, for example in phase area B, the state of the ET-FSM 134 may move to a second fast state FAST2. When the state of the ET-FSM 134 is FAST2 and the detected edge is located after phase area B, for example in phase area C, the state of the ET-FSM 134 may move to a third fast state FAST3. When the state of the ET-FSM 134 is FAST3 and the detected edge is located after phase area C, for example in phase area D, the state of the ET-FSM 134 may move to a fourth fast state FAST4.

When the state of the ET-FSM 134 is NORM and the detected edge is located in phase area C or D, the state of the ET-FSM 134 may keep the state NORM. Moreover, the state of the ET-FSM 134 may keep a reset state RESET while a system reset signal resets the ET-FSM 134. When the state of the ET-FSM 134 is released from RESET state, the next state of the ET-FSM 134 may be determined by the current detected edge position (A, B, C, and D). For example, the state of the ET-FSM 134 may move from RESET state to NORM state when the detected edge position belong to phase area C or D as illustrated in FIG. 4. The state of the ET-FSM 134 may move from RESET state to SLOW1 state or FAST1 state when the detected edge position belong to phase area B or A respectively as illustrated in FIG. 4.

Although the state of the ET-FSM 134 is allowed to move to the very next state of the ET-FSM 134 according to the example embodiment in FIG. 4, the state change of the ET-FSM 134 is not limited thereto but may be allowed to other states skipping the very next state of the ET-FSM 134 to increase the edge tracking speed.

Figure 5:
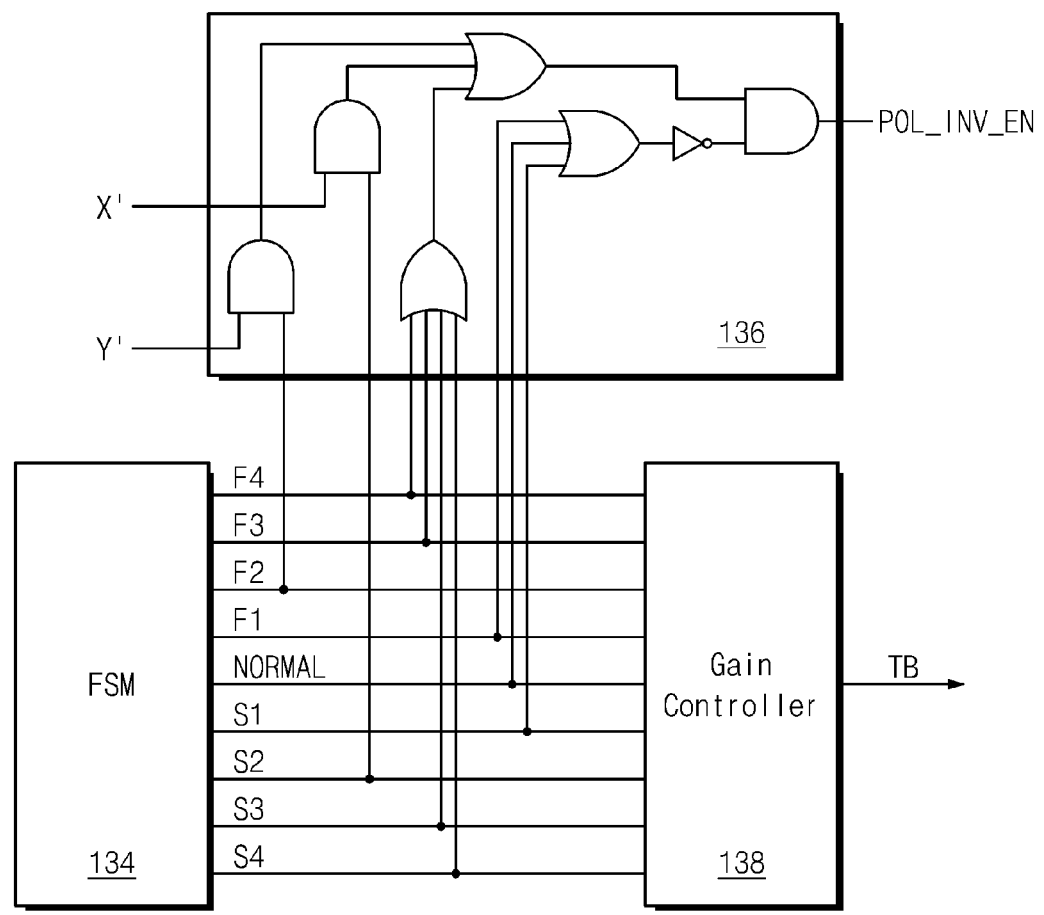
FIG. 5 is a block diagram of a polarity decision unit 136 according to an example embodiment of the present inventive concepts.

FIG. 5 is a block diagram of a polarity decision unit 136 according to an example embodiment of the present inventive concepts.

Referring to FIG. 5, the polarity decision unit 136 may include a plurality of logic gates. The polarity decision unit 136 may receive a pre-polarity signal X' and Y' from the first phase detector 120 and output the polarity inversion signal POL_INV_EN to the first phase detector 120 based on the pre-polarity signal X'/Y' and the states of the ET-FSM 134.

When the state of the ET-FSM 134 is SLOW2 and the detected edge of the incoming data bit is located in the right side of the data eye center (phase 0° point in FIG. 3), for example in phase area B or C (LEAD), the polarity decision unit 136 may activate the polarity inversion signal POL_INV_EN high. Also, When the state of the ET-FSM 134 is FAST2 and the detected edge is located in the left side of the data eye center, for example in phase area D or A(LAG), the polarity decision unit 136 may activate the polarity inversion signal POL_INV_EN high. Thus, the clock data recovery circuit 100 may keep the shift direction to adjust sampling points.

In case of the state FAST3 and FAST4, even if the detected edge is located in phase area C or D, the sampling point is considered to be early compared to the state NORM so that the polarity signal X and Y needs to be inversed to shift the sampling point to the right side.

In case of the state SLOW3 and SLOW4, even if the detected edge is located in phase area C or D, the sampling point is considered to be late compared to the state NORM so that the polarity signal X and Y needs to be inversed to shift the sampling point to the left side.

When the state of the ET-FSM 134 is NORM, SLOW1, or FAST1, the polarity decision unit 136 may deactivate the polarity inversion signal POL_INV_EN.

Figure 6:
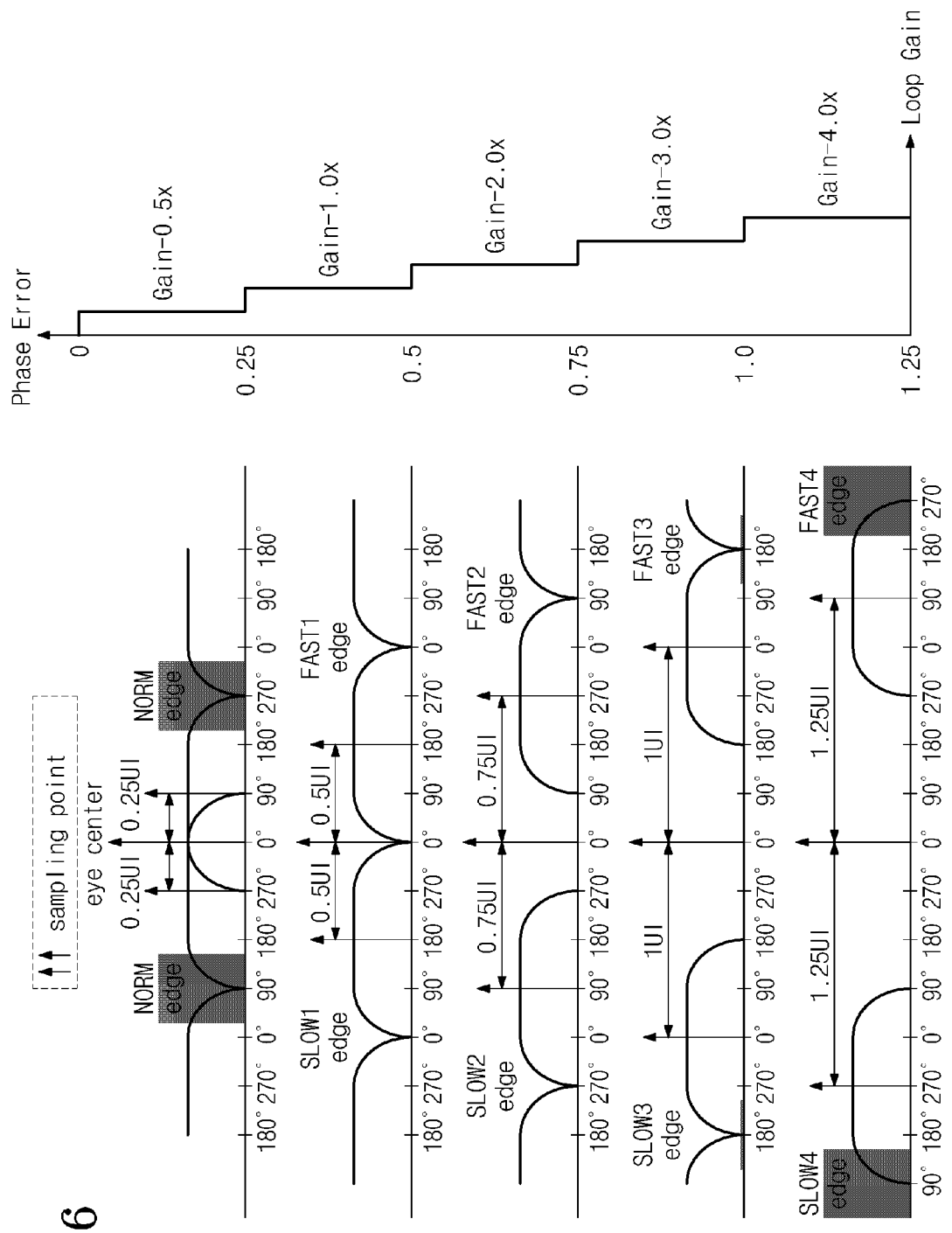
FIG. 6 is a graph to illustrate relationship between the state of the ET-FSM 134 and a stepwise control of the gain controller shown in FIG. 1.

FIG. 6 is a graph to illustrate relationship between the state of the ET-FSM 134 and a stepwise control of the gain controller shown in FIG. 1.

Referring to FIG. 6, when the state of the ET-FSM 134 may be NORM when the detected edge is between −0.25 UI and +0.25 UI from the center of the incoming data bit. The maximum allowable phase difference is 0.25 UI in this case. While the state of the ET-FSM 134 changes step by step from NORM to SLOW4 and from NORM to FAST4, the maximum allowable phase difference is moving from 0.25 UI to 1.25 UI. According to the sequence of state transition described in FIG. 4, the detectable phase difference may be allowable up to 1.25 UI. However, the phase difference which is possible to track may be wider than 1.25 UI based on a fast logic speed and saving more states of the ET-FSM 134.

The ET-FSM 134 may indicate phase difference between the data eye center and the detected edge position of the incoming data bit based on the saved state of the ET-FSM 134 and the detected edge position. The gain controller 138 may output the tracking bandwidth TB to the recovery loop 140 based on the phase difference.

The tracking bandwidth signal TB may be a stepwise gain signal. For example, when the state of the ET-FSM 134 is NORM, the tracking bandwidth TB may be 0.5. While the state of the ET-FSM 134 changes from NORM to SLOW4 and from NORM to FAST4, the tracking bandwidth TB may increase discretely from 0.5 to 4.0 as illustrated in FIG. 6. By making the magnitude of the tracking bandwidth signal TB vary stepwise, the gain controller 138 may control the phase or frequency of the multi-phase clock signal MPCLK generated from the interpolator 146 in the recovery loop 140 effectively.

Referring to FIGS. 1 to 6, the clock data recovery circuit 100 may have a plurality of operation modes according to the operating frequency relationship between the incoming data bit rate and the reference clock signal RCLK frequency. The plurality of operation modes may be set by a mode signal provided by a controller, an external device or a mode pin to set the operation mode.

In the first operation mode, the reference clock signal RCLK and the incoming data bit rate of the clock data recovery circuit 100 may have a first frequency and a second bit rate respectively, which are different transfer speeds in view of 1 data bit per 1 clock cycle. For example, the first frequency may be 3 GHz and the second bit rate may be 6 Gb/s. The second operation mode, the reference clock signal RCLK and the incoming data bit rate of the clock data recovery circuit 100 may have the first frequency and the first bit rate respectively, which are the same transfer speeds in view of 1 data bit per 1 clock cycle. For example, the first frequency may be 3 GHz and the first bit rate may be 3 Gb/s. Although the transfer speed of the reference clock signal RCLK may have a very small difference from that of the incoming data bit rate in view of 1 data bit per 1 clock cycle, they may be considered substantially same in the second operation mode when the small difference in frequency is allowable within a specification margin.

In the first operation mode, if the clock data recovery circuit 100 use both edge (rising/falling) of the reference clock signal RCLK for multi-phase clock signal MPCLK to sample the incoming data bits, the clock data recovery circuit 100 can sample the incoming data bit at half rate of the incoming data bit rate. For example, when the bit rate of the incoming data bit is 6 Gb/s, the frequency of the reference clock may be 3 GHz.

In the first operation mode, when the bit rate of the incoming data bit is 6 Gb/s, the frequency of the reference clock signal RCLK may be 3 GHz, the first phase detector 120 of the phase detector 110 may sample the incoming data bits at phase 0° and phase 180° based on the reference clock signal RCLK. Here, the second phase detector 130 may be deactivated and may make the phase detector 110 operate like a conventional bang-bang phase detector. Thus, the sampler 105 may output two sampled data bits at phase 0° and 180° based on the half rate reference clock signal RCLK compared to the incoming data bit rate, detect edge position by the first detector 120, retime the multi-phase clock signal MPCLK, and recover the incoming data bits as a result.

On the other hands, in the second operation mode, when the clock data recovery circuit 100 may sample incoming data bits having the first bit rate, for example 3 Gb/s bit rate, at full rate reference clock signal having the first frequency, for example 3 Hz to oversample the incoming data bits.

In the second operation mode, the first phase detector 120 and the second phase detector 130 may be combined together as a composite phase detector as described in FIG. 1 to 5. For example, when the clock data recovery circuit 100 may receive incoming data bits at bit rate 3 Gb/s, the first phase detector 120 of the phase detector 110 may sample the incoming data bits twice at phase 0°, 180° based on a 3 GHz reference clock signal RCLK. Furthermore, the second phase detector 130 may oversample the incoming data bits 4 times at phase 0°, 90°, 180° and 270° based on the same 3 GHz reference clock signal RCLK.

In the second operation mode, the clock data recovery circuit 100 may oversample the incoming data bits and generate the edge position signal EDGE_POS very quickly such that the clock data recovery circuit 100 may recover the incoming data bits fast and have a low latency. Furthermore, the clock data recovery circuit 100 may have high jitter tolerance and low lock time by applying the adaptive method to boost the recovery speed that provides the stepwise tracking bandwidth signal TB to the recovery loop 140.

When the incoming data bits are recovered by the bit selector 150, the incoming data bits may be recovered by selecting the data closest to the eye center based on the current edge position and the state of the ET-FSM 134 as shown in FIG. 6. Since the gain controller 138 along with the ET-FSM 134 compensates a frequency offset instead of an elastic FIFO of the conventional oversampling phase detector by adopting a finite state machine, EF-FSM 134, an additional delay to retime the multi-phase clock signal MPCLK doesn't occur to the recovery loop 140. Each sampling point may be determined depending on the estimated phase errors as shown in FIG. 6. The realized latency to recovery the incoming bits may be less than 2 baud period.

As a result, the clock data recovery circuit 100 may operate with a half rate reference clock and have low latency and long lock time like using a conventional bang-bang phase detector in the first operation mode, and may operate with a full rate reference clock and have low latency and low lock time in the second operation mode for many applications such as MIPI LLI, UFS, etc. Thus, the clock data recovery circuit 100 may be configured to operate as a hybrid clock data recovery clock circuit according to a frequency of a reference clock and an incoming data bit rate.

Figure 7:
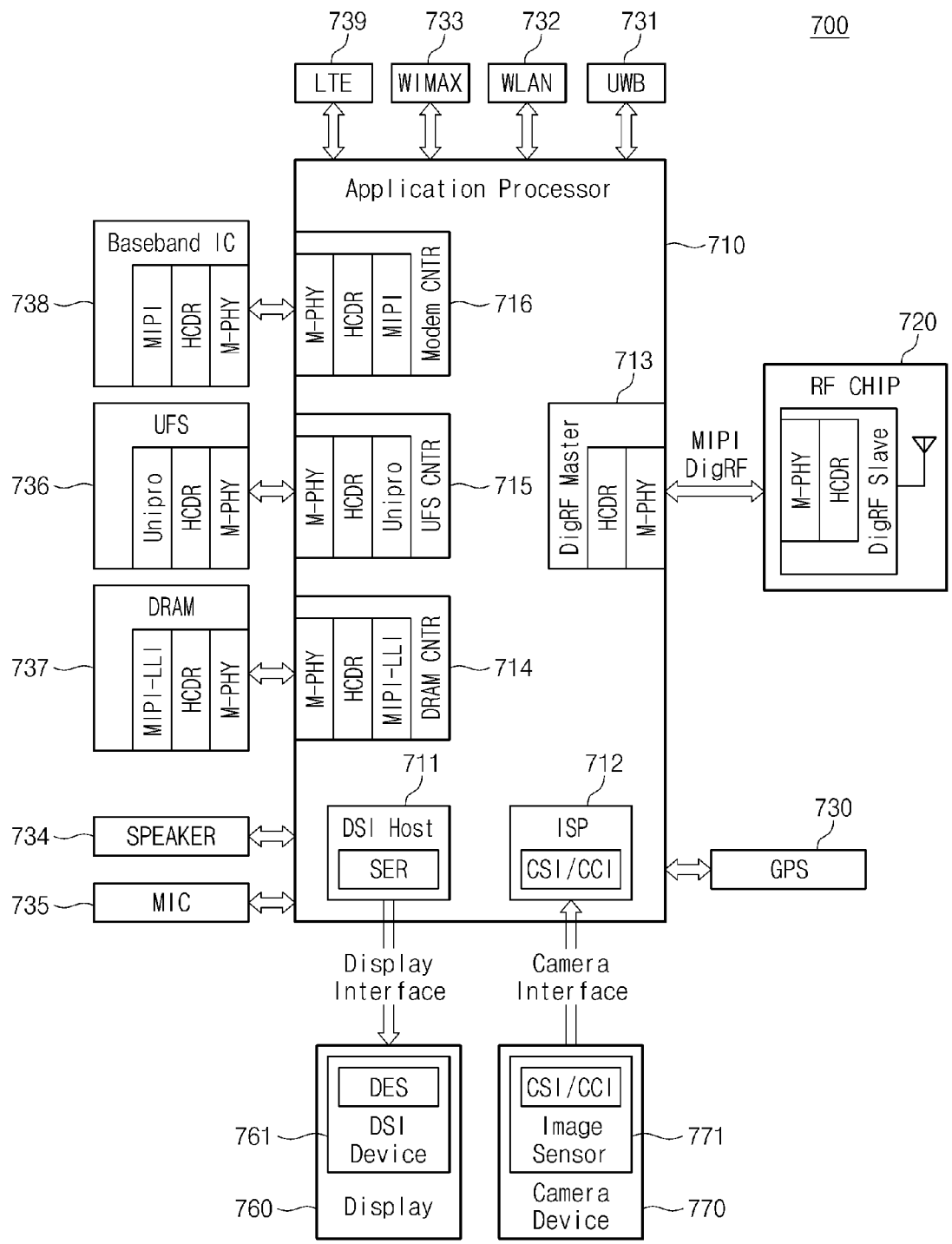
FIG. 7 is a block diagram of a data processing system according to an example embodiment of inventive concepts.

FIG. 7 is a block diagram of a data processing system according to another example embodiment of inventive concepts.

Referring to FIGS. 1 to 7, a data processing system 700 may be a portable electronic device. The data processing system 700 may support a standard protocol such as a mobile industry processor interface (MIPI®) standard and an Embedded DisplayPort (eDP) standard.

The data processing system 700 may be embodied in a laptop computer, a personal digital assistant (PDA), a portable media player (PMP), a mobile phone, a smart phone, a tablet personal computer (PC), a digital camera, a mobile internet device (MID), or a wearable computer.

The data processing system 700 may include an application processor (AP) 710, a storage device 736, a memory device 737 and a baseband (modem) IC 738. The application processor 710 may include a modem interface 716 connected to the baseband IC 738, a storage interface 715 connected to the storage device 736 and a memory interface 714 connected to the memory device 737. The data storage device 736 may be a UFS (Universal Flash Storage) memory device having a non-volatile memory such as a NAND flash memory. The memory device 737 may be a DRAM.

Each of the modem interface 716, the storage interface 715, the memory interface 714, the baseband IC 738, the storage device 736 and the memory device 737 may include a physical layer M-PHY, a hybrid clock data recovery circuit HCDR, an interface such as MIPI-LLI and Unipro and a controller respectively. Each of the hybrid clock data recovery circuits HCDRs in the data processing system 700 may be the clock data recovery circuit 100 shown in FIG. 1. Operation modes of the HCDRs may be set by a mode signal provided from the application processor 710 or generated from mode pins to set the operation modes.

The memory device 737 may be shared by the baseband IC 738 and the application processor 710 through a common interface such as the MIPI-LLI interface. According to the example embodiments of the inventive concepts, the hybrid clock data recovery circuit 100 in FIG. 1 can have a low latency and a low lock time with high jitter tolerance and can meet the specification of the MIPI-LLI interface. Furthermore, the hybrid clock data recovery circuit HCDRs may be used for various specifications by setting operation mode as described in FIGS. 1 to 6.

The data processing system 700 may further include a camera device 770 having a CMOS image sensor 771, and a display 760 having a display serial interface (DSI).

The CMOS image sensor 771 may include a camera serial interface (CSI) and a camera control interface (CCI) to setup the camera device 770. The camera device 770 may perform a serial communication with the ISP 712 to transfer image data from the camera device 770 to an image signal processor (ISP) 712 through a camera serial interface (CSI) and a camera control interface (CCI).

A display serial interface (DSI) host 711 embodied in the AP 710 may perform the serial communication with a DSI device 761 of the display 760 through a display serial interface (DSI). According to an example embodiment, a serializer SER may be embodied in the DSI host 711, and a de-serializer DES may be embodied in the DSI device 761. Each of the deserializer DES and the serializer SER may process an electrical signal or an optical signal.

The data processing system 700 may further include a radio frequency (RF) chip 720 which can communicate with the AP 710. The AP 710 may include a DigRF master 713 to perform a serial communication with the RF chip 720 through DigRF standard protocol. A physical layer M-PHY in the DigRF master 713 of the AP 710 and a physical layer M-PHY of the RF chip 720 may transmit or receive data according to MIPI DigRF interface.

The data processing system 700 may further include a GPS receiver 730, a microphone 734, and a speaker 734.

The data processing system 700 may communicate with an external device using at least one communication protocol or communication standard, e.g., worldwide interoperability for microwave access (WiMAX) 733, Wireless LAN (WLAN) 732, ultra-wideband (UWB) 731, or long term evolution (LTE™) 739. The data processing system 700 may communicate with an external device using Bluetooth or WiFi.

Although example embodiments of inventive concepts have been shown and described, it will be appreciated by those skilled in the art that changes may be made in example embodiments without departing from the principles and spirit of inventive concepts, the scope of which is defined in the appended claims and their equivalents.

What is claimed is:

1. A clock data recovery circuit comprising:
a sampler configured to generate a first set of sampling data bits based on incoming data bits inputted at a first bit rate, or generate a second set of sampling data bits based on the incoming data bits inputted at a second bit rate;
a first phase detector configured to generate a first edge position signal based on the first set of sampling data bits or the second set of sampling data bits;
a second phase detector configured to generate a second edge position signal based on the second set of sampling data bits; and
a bit selector configured to recover the incoming data bits based on the first edge signal and the second edge signal,
wherein the first phase detector is configured to generate a polarity signal based on the first edge position signal and the second phase detector includes,
an oversampling phase detector configured to generate the second edge position signal;
a finite state machine configured to save a current edge position state based on the second edge position signal;
a polarity decision unit configured to output a polarity inversion signal to the first phase detector; and
a gain controller to configured to generate a tracking bandwidth signal based on the current edge position state.

2. The clock data recovery circuit in claim 1, wherein the sampler is configured to sample the incoming data bits inputted at the first bit rate at quadrature phases or is configured to sample the incoming data bits inputted at the second bit rate at dual phases according to a multi-phase clock signal.

3. The clock data recovery circuit in claim 1, wherein the first phase detector is a bang-bang phase detector.

4. The clock data recovery circuit in claim 1, wherein the second phase detector is an oversampling phase detector.

5. The clock data recovery circuit in claim 1, further comprising:
a recovery loop configured to adjust an edge offset of the multi-phase clock signal based on the polarity signal and the tracking bandwidth signal.

6. The clock data recovery circuit in claim 5, wherein the polarity decision unit is configured to invert the polarity signal based on the current edge position state and the first edge position signal.

7. The clock data recovery circuit in claim 6, wherein the recovery loop comprises:
a proportional gain unit configured to generate a proportional gain;
an integrator configured to accumulate a polarity decision result based on the polarity signal;
an integral gain unit configured to generate an integral gain based on the accumulated polarity decision result;
an adder configured to generate an added gain by adding the proportional gain and the integral gain; and
an interpolator configured to adjust the edge offset of the multi-phase clock signal based on the polarity signal and the tracking bandwidth signal.

8. The clock data recovery circuit in claim 7, wherein the magnitude of the tracking bandwidth signal varies in discrete steps according to the current edge position state.

9. The clock data recovery circuit in claim 1, wherein the first bit rate is half of the second bit rate.

10. The clock data recovery circuit in claim 9, wherein the incoming data bits are inputted to the sampler at the first bit rate in a first operation mode or at the second bit rate in a second operation mode.

11. The clock data recovery circuit in claim 1, wherein the polarity decision unit is configured to activate the polarity inversion signal when an edge position of the incoming data bits detected based on the first edge position signals and the current edge position state is out of 1-bit boundary of the incoming data bits.

12. A data recovery circuit comprising:
a sampler configured to generate a first set of sampling data bits in a first operation mode or generate a second set of sampling data bits in a second operation mode by sampling incoming data bits based on a multi-phase clock signal;

a phase detector configured to generate an edge position signal and a polarity signal based on the first set of sampling data bits or the second set of sampling data bits;

a finite state machine configured to save a current edge position state based on the edge position signal;

a polarity decision unit configured to generate a polarity inversion signal to invert the polarity signal based on the saved edge position state and the edge position signal;

a gain controller configured to generate a tracking bandwidth signal based on the saved edge position state;

a recovery loop configured to adjust an edge offset of the multi-phase clock signal based on the polarity signal and the tracking bandwidth signal; and a bit selector configured to recover the incoming data bits based on the saved edge position state.

13. The data recovery circuit in claim 12, wherein the incoming data bits are inputted at a first bit rate in the first operation mode and the incoming data is inputted at a second bit rate in the second operation mode.

14. The data recovery circuit in claim 12, wherein the phase detector comprises a first phase detector configured to generate a first edge position signal based on the first set of sampling data bits or the second set of sampling data bits; and a second phase detector configured to generate a second edge position signal based on the second set of sampling data bits.

15. The data recovery circuit in claim 12, wherein the magnitude of the tracking bandwidth varies in discrete steps according to the saved edge position state.

16. The clock data recovery circuit in claim 14, wherein the polarity decision unit is configured to activate the polarity inversion signal when an edge position of the incoming data bits detected based on the edge position signal and the current edge position state is out of 1-bit boundary of the incoming data bits.

17. A data processing system comprising :
a universal flash storage (UFS) interface configured to communicate at a first bit rate;
a mobile industry process interface low latency interface (MIPI LLI) configured to communicate at a second bit rate;
a first hybrid clock and data recovery (CDR) circuit connected to the UFS interface; and
a second hybrid CDR circuit connected to the MIPI LLI interface,
wherein each of the first hybrid CDR circuit and the second hybrid CDR circuit includes,
a phase detector configured to generate an edge position signal and a polarity signal based on a first set of sampling data bits or a second set of sampling data bits;
a finite state machine configured to save a current edge position state based on the edge position signal; and
a polarity decision unit configured to generate a polarity inversion signal to invert the polarity signal based on the saved current edge position state and the edge position signal.

18. The data processing system in claim 17, further comprising :
an application processor;
a baseband integrated circuit (IC); and
a memory having the MIPI LLI interface shared by the application processor and the baseband IC.

* * * * *